United States Patent [19]
Libres et al.

[11] Patent Number: 5,949,132
[45] Date of Patent: *Sep. 7, 1999

[54] DAMBARLESS LEADFRAME FOR MOLDED COMPONENT ENCAPSULATION

[75] Inventors: Jeremias L. Libres, Dallas, Tex.; Raymond A. Frechette, North Providence, R.I.; Mario A. Bolanos, Plano, Tex.; Ireneus J. T. M. Pas, Rozendaal, Netherlands

[73] Assignee: Texas Instruments Incorporated, Dallas, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/434,137

[22] Filed: May 2, 1995

[51] Int. Cl.$^6$ .................................................. H01L 23/495
[52] U.S. Cl. ......................... 257/666; 257/670; 257/676; 257/787
[58] Field of Search ................................... 257/666, 676, 257/787, 670

[56] References Cited

U.S. PATENT DOCUMENTS

| | | | |
|---|---|---|---|
| 4,899,207 | 2/1990 | Hallowell et al. | 257/671 |
| 5,098,626 | 3/1992 | Pas | 264/151 |
| 5,106,784 | 4/1992 | Bednarz | 437/214 |
| 5,336,927 | 8/1994 | Suetake | 257/670 |
| 5,471,097 | 11/1995 | Shibata | 257/666 |
| 5,486,722 | 1/1996 | Sato et al. | 257/666 |

FOREIGN PATENT DOCUMENTS

| | | | |
|---|---|---|---|
| 0 665 584 | 2/1995 | European Pat. Off. | H01L 21/56 |
| 2 103 917 | 4/1972 | France | H05K 5/00 |
| 63-056948 | 11/1988 | Japan | H01L 23/50 |

*Primary Examiner*—Peter Toby Brown
*Assistant Examiner*—Roy Potter
*Attorney, Agent, or Firm*—Mark E. Courtney; W. James Brady, III; Richard L. Donaldson

[57] ABSTRACT

A method and apparatus for encapsulating an integrated circuit die and leadframe assembly using dambarless leadframes. Dambarless leadframe 191 is formed having leads 193 that are widened in the region near the package edge such that the interlead spacing between adjacent leads is less than a predetermined minimum distance. Lower and upper mold release films 67 and 65 are stretched over a plurality of die cavities formed in bottom and top mold chases 179 and 173. The release films can be further stretched into the die cavities by a vacuum. Leadframe strip assemblies containing the dambarless leadframes, each holding integrated circuit dies 189, are placed such that the integrated circuit dies are each centered over a bottom mold die cavity 63 and over the bottom mold release films 65. When the top and bottom mold chases are superimposed, the mold release films 67 and 65 are clamped together, and an interface is formed at the edges of the top and bottom mold cavities and between the leads of the dambarless leadframe. The mold compound is forced into the cavities by pressure. The interface between the top and bottom release films prevents the mold compound from forming mold flash between the leads of the dambarless leadframe. The dambarless leadframe includes a specific support tape 197 for the internal leads and a specialized open gate design.

9 Claims, 6 Drawing Sheets

DAMBARLESS LEADFRAME FOR MOLDED COMPONENT ENCAPSULATION

FIELD OF THE INVENTION

This invention relates generally to the field of integrated circuits and more particularly to the design of leadframes for use with encapsulation packaging of integrated circuits, and specifically to the use of leadframes without dambars in transfer molding processes.

BACKGROUND OF THE INVENTION

In producing integrated circuits, it is desirable to provide packaged integrated circuits having plastic, epoxy or resin packages which encapsulate the die and a portion of the lead frame and leads. These packages have been produced using a variety of methods, a few of which will be described here.

Conventional molding techniques take advantage of the physical characteristics of the mold compounds. For integrated circuit package molding applications, these compounds are typically thermoset compounds. These compounds consist of an epoxy novolac resin or similar material combined with a filler, such as alumina. Other materials such as accelerators, curing agents, fillers, and mold release agents are added to make the compound suitable for molding.

The transfer molding process as known in the prior art takes advantage of the viscosity characteristics of the molding compound to fill cavity molds containing the die and leadframe assemblies with the mold compound, which then cures around the die and leadframe assemblies to form a solid, coherent, package which is relatively inexpensive and durable, and a good protective encapsulation for the integrated circuit.

Transfer molding operations have three stages which correspond to the three phases of viscosity of thermoset mold compounds. First there is a preheat stage required to move the mold compound from its hard initial state to the low viscosity state. Second is a transfer stage, where the compound is low in viscosity and easily transported and directed into cavities and runners. This transfer process should be rapid and should be completed before the mold compound begins to set. Finally there is a cure stage that occurs following the transfer stage. Thermoset compounds are heat cured. Other compounds may not require heat to cure, such as thermoplastics.

Figure 1:
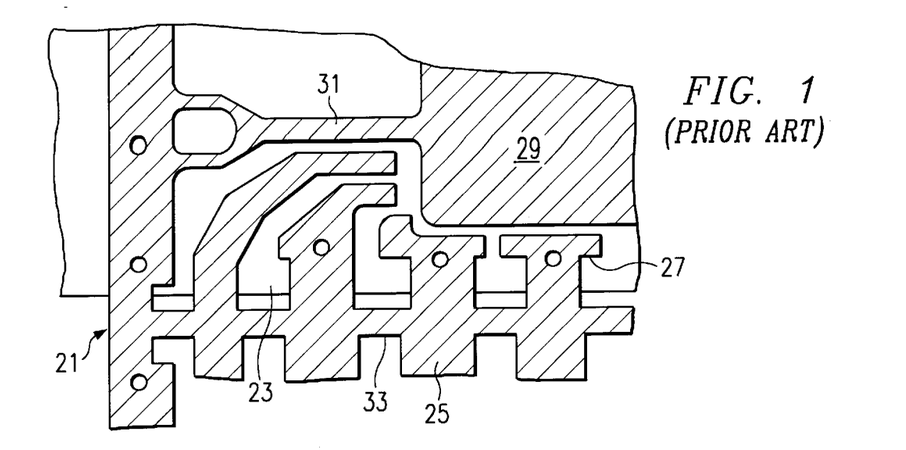
FIG. 1 depicts a prior art leadframe having a dambar.

Conventional transfer molding techniques also require leadframes which include dambars. FIG. 1 depicts a conventional lead frame assembly and package. In FIG. 1, lead frame 21 is depicted, and package 23 is shown in cutaway from the top of the lead frame 21. The leads 25 are shown coupled together outside of the outer edge of package 23 by dambar 33. Die pad 29 is positioned to receive the integrated circuit die and support the die. Die pad support strap 31 is used to keep the die and support pad 29 planar during the die attach, bonding and molding operations.

Figure 2:
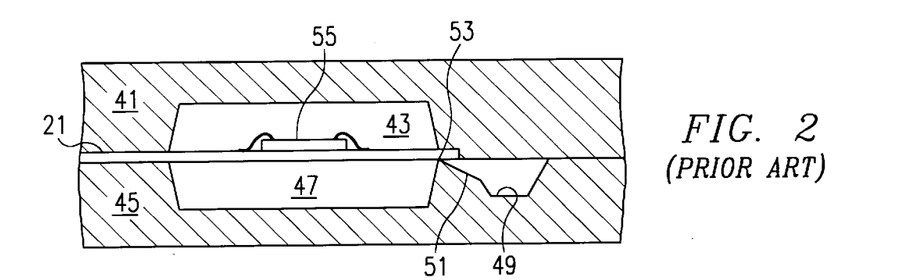
FIG. 2 depicts a cross-sectional view of a prior art transfer mold for encapsulating a lead frame with mold compound.

FIG. 2 depicts in a cross-sectional view a lead frame and die assembly in a prior art transfer mold cavity. Leadframe 21 is placed in-between a top mold chase 41 having a top mold cavity 43 and a bottom mold chase 45 having a bottom mold cavity 47. Primary runner 49 is coupled to secondary runner 51 and to gate 53. Integrated circuit die 55 is shown positioned on the die support pad of lead frame 21.

In operation, the mold compound is typically heated to attain a low viscosity state. The mold compound is then forced by compression into the primary runner 49 from a mold pot or other mold compound source, which is not shown. Secondary runner 51 then routes the mold compound over gate 53 into the cavity formed by the top and bottom cavities 43 and 47. The mold compound is forced through the narrow gate 53 into the cavity until the cavity fills with mold compound to form the encapsulated package which will have a shape defined by the shape of the top and bottom mold cavities 43 and 47.

Since the mold cavity is closed around the leadframe 21, and the leads extend outward beyond the edge of the cavities 43 and 47, there is a space between the leads, not visible in FIG. 2, where the mold compound can be forced out through the space and travel out from the cavities between the leads of leadframe 21. The dambar, which is shown in FIG. 1 but is not visible in FIG. 2, acts as a stop and allows the mold compound to travel out a short distance, but no farther. This extra mold compound forms flash between the leads, the flash forming in the area between the edge of the package and the dambar.

Therefore, in the prior art transfer molding process that uses a mold cavity to form a package around the leadframe as shown in FIG. 2, the dambar of FIG. 1 acts as a physical stop to prevent the mold compound from flowing out from the cavity area of the mold chases and forming an interlead flash or sprue joint between adjacent leads. The dambar is required to mold the package. After the package is completed, the conventional process flow is to remove the metal dambar and the flash, using metal trim and compound deflash technology. The dambar also provides lead-to-lead stability during processing and lead planarity during processing. Once the package is completed and cured, the dambar is no longer needed for stability and is removed.

As the number of pins increases to above 200 pins, the pitch between leads is decreasing. Also, thinner package requirements result in a requirement for thinner leadframes. So called "fine pitch" leadframes are now required. The lead-to-lead pitch for a fine pitch leadframe is typically less than 0.5 millimeters. The conventional dambar approach is no longer economically satisfactory for the production of fine pitch lead frames, because the trim and flash steps are so difficult to achieve.

These thinner lead frames with decreased lead-to-lead pitch are costly to process. Increased accuracy and handling precision is required for each step of the process. Costs of production increase as these requirements increase. Two important production cost drivers are the dambar trim and interlead flash removal steps. To remove the dambar and flash after molding for a fine pitch leadframe will require extremely precise machining during both the trim and flash removal stages of processing. The trim stage will become extremely difficult and require increasingly accurate and expensive equipment as the lead to lead pitch continues to decline. The deflash stage is a mechanical or chemical step which requires either additional precision machining or chemical processing, which also leads to chemical waste disposal costs.

Accordingly, a need thus exists for a package encapsulation molding system which uses a leadframe without a dambar to produce packaged integrated circuits having fine pitch leads. Eliminating the dambar also eliminates the problems and costs of the prior art trim and deflash processing steps. The molding system should provide a high part per hour throughput rate, low raw material costs, and be simple to operate, maintain, and use molding stations that are relatively inexpensive to build. The new system should be compatible with existing single pot transfer mold presses to allow a retrofitting of existing integrated circuit assembly lines.

SUMMARY OF THE INVENTION

A dambarless leadframe and molding system for transfer molding the packages of integrated circuits having fine pitch leadframes and using mold release films is provided. The mold compound is packaged as inserts in a plastic packaging that is sealed at the edges by a removable or reversible seal. As the package is heated in the mold, these edge seals become flexible. The prepackaged mold compound can then be pushed through the edge seals at places adjacent to the mold runners during the transfer molding process. The protective packaging ensures that the mold compound is free from moisture and air contamination and is easily produced, stored and shipped.

An improved mold design is used in combination with the mold compound inserts. The mold chases include rectangular receptacles for receiving the pencil shaped inserts of prepackaged mold compound. A rectangular plunger is provided for each of the receptacles. Each package cavity is preferably equidistant from the receptacle containing the mold compound, providing improved uniformity of fill and allowing for complete fill of the cavities with reduced wire sweep as compared to the transfer molds of the prior art. The rectangular plunger is inserted and forced against the prepackaged mold compound, and the mold compound is forced through the edge seals of the protective packaging into short runners coupling the mold receptacle to the cavities. The mold compound then hardens and completes the molding process.

A release film is preferably used with the mold compound. The mold cavities are covered with a release film before the leadframe assemblies are placed inside the mold receptacle. A vacuum is used to stretch the release film into the cavities within the mold chases. A top and a bottom release film are each stretched over the top and bottom mold chases, respectively. The mold is closed and the release films are positioned around the cavities and therefore around the integrated circuit die and die pad. The leads of the leadframe extend out of the cavity and are positioned between the top and bottom release films. When the mold is closed and the dambar and release films are compressed together the two pieces of release film elongate and form an interface that closes the gap that exists between the leads at the edge of the cavity. As the mold compound is fed into the cavity, the mold compound falls within the space between the two release films and encapsulates the die and die pad. The release film now also serves as a barrier at the edges of the cavity and stops the mold compound from transferrng or traveling outside the cavity, thus eliminating the need for the dambars of the prior art leadframes.

A dambarless leadframe is provided. The leadframe of the invention is designed to work with the release film to prevent the mold compound from forming interlead mold compound flash outside of the cavity area. The dambarless leadframe also includes additional support means as required to provide the lead planarity and stability previously provided by the dambar, to ensure the leads remain in place during molding. This support means may be, in one embodiment, a tape placed inside the package edge area to provide the needed planarity and stability. Alternatively an adhesive or polymer support may be provided. The support means is kept at an equal or substantially constant distance from the inner lead ends to provide improved support. Also, the leadframe leads are preferably wider at the package edge area to reduce the interlead distance in the region adjacent to the cavity edge. This reduced interlead distance will reduce the likelihood that interlead flash will be formed. This reduced interlead distance also improves the ability of the release films to stop compound flow outside the mold cavities. An open gate design is used to further enhance the operation of the molding process and the release films. The leadframe is produced using conventional leadframe production methods.

BRIEF DESCRIPTION OF THE DRAWINGS

Corresponding numerals are used for corresponding elements in the drawings, unless otherwise indicated in the text.

DETAILED DESCRIPTION OF PREFERRED EMBODIMENTS

The leadframe of the invention is formed without the dambar of the prior art. The leadframe may be stamped out, or a pattern and etch process can be used to produce the leadframes without the dambar, or dambarless leadframes, using production techniques well known in the prior art. One exemplary leadframe is made from a plated copper or nickel alloy substrate, such as Alloy 42, which is plated with palladium and then spot plated with silver to enhance solderability. Other leadframes known to the prior art may also be used, so long as the dambar is removed and other inventive modifications described herein are made. The process for producing packaged IC's using the dambarless leadframe is now described.

Figure 3:
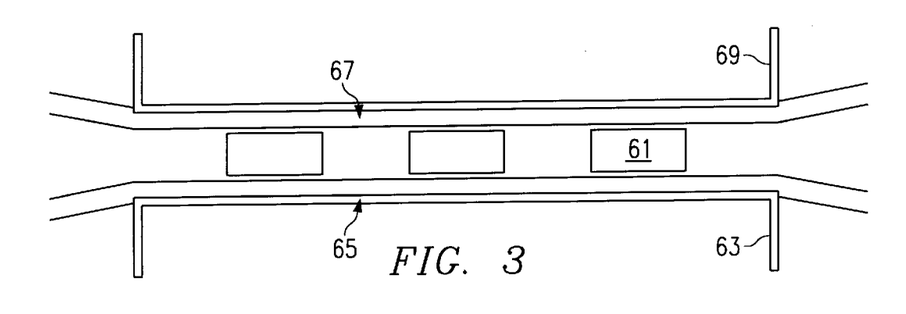
FIG. 3 depicts a cross-sectional view of the release films and leadframe of the invention.

FIG. 3 depicts a cross-sectional view of a mold cavity illustrating the process of transfer molding using mold compound and release films to encapsulate a dambarless leadframe in accordance with the invention. In FIG. 3, leadframe leads 61 are shown positioned between bottom release film 65, which is stretched over bottom cavity 63, and top release film 67, which is stretched over top cavity 69. The release films advantageously protect the mold surfaces from the molding compound. Since conventional molding compound is an abrasive, the longevity of the mold surfaces is enhanced using the release films 65 and 67. Further, the release films allow the use of molding compounds which are highly abrasive as compared to conventional resin or resin filled compounds, and also compounds which do not readily release from the mold surfaces after cure, such as adhesive compounds. Epoxies and clear epoxies can be used, particularly, to advantage for photodiode IC's, CCD IC's and other devices which are packaged such that they can sense or emit light. Conventional molding compounds are required to release from the mold after cure.

Figure 4:
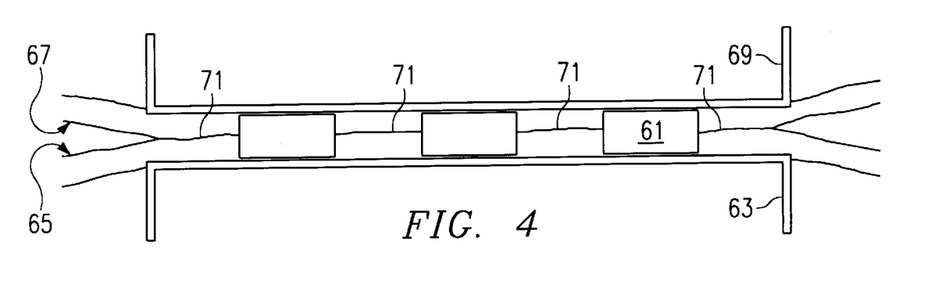
FIG. 4 depicts a second cross-sectional view of the release films and leadframe of the invention.

FIG. 4 illustrates the use of the release films and cavities of FIG. 3 to mold a package with the dambarless lead frame of the invention. In FIG. 4, top mold cavity 69 and bottom mold cavity 63 are clamped together around leadframe 61. This action brings the top and bottom release films 65 and 67 in close proximity. The release films will fall together and form a seam or interface between the leads in spaces 71. This seam prevents the mold compound from being forced out of the mold cavities and forming interlead flash.

In operation, the release films 67 and 65 are stretched across the mold cavities 69 and 63 while the mold is open, between runs or "shots". Leadframe 61 is positioned over the bottom mold cavity 63. The mold is supplied with mold compound in a mold pot or receptacle which is not shown in FIG. 4. The top and bottom molds are clamped together so that top cavity 69 is clamped over leadframe 61 and bottom cavity 63, and the top release film 67 is clamped over the bottom release film 65. A seam forms in the spaces 71 between the leads of the leadframe 61. The release film stretches in-between these leads due to the heat in the molding process, which makes the film stretch farther than when it is cold. The mold compound is forced into the cavities between the top and bottom release films.

The seam in spaces 71 keeps the mold compound from leaving the cavity and forming interlead flash between the leads, as would occur in prior art molding processes. The seam also therefore eliminates the need for the dambar used on prior art lead frames. Eliminating the flash and the dambar dispenses with the expensive and precise steps of removing the flash and the dambar after molding. This is especially advantageous in the production of integrated circuits using fine pitch leadframes, where the tooling required to remove the dambar and flash is particularly expensive.

The release films used in the molding process may be of many materials, but the material chosen should have certain specific characteristics. The release film should have a melting point higher than that of the mold compound being used and higher than that of the molding process being used, so it will not melt away during the process. The release film should not contaminate the mold with residues. The release film should release from the mold after molding is completed. The release film should not contaminate the molded package with ions or other harmful substances which would reduce the life or reliability of the package.

Also, the release film should be able to stretch in response to the mold compound pressure, but not break. That is, the release film elongates during the molding process without tearing. For the package to be formed correctly the release film should keep the mold compound contained between the top and bottom films 65 and 67. A set of selection criteria for release films to be used in the process of the invention has been developed. The release film should also be thick enough to fill in the spaces 71 between the external leads during molding, so that no interlead flash or splinters of molding compound form, because if this happens, the flash removal step will have to be performed. Typically the release film should be 100 microns–200 microns thick for typical leadframes, and less for thinner leadframes such as extremely fine pitch leadframes. The top and bottom release films may be of different thicknesses. The thickness required for optimal performance will vary somewhat with the thickness, type, and interlead spacing of the particular leadframe being molded.

One type of release film which meets these criteria is known commonly as ETFE, and contains tetrafluoroethylene and ethylene monomer units. The film is a flouroplastic material. Such films are available from a variety of sources. One particular film that gives good results is Hostaflon™ ET 6235J and Hostaflon™ ET 6210 J, available from Hoescht High Chem, Hoeschst Aktiengesellschaft, Marketing Hostaflon, D-6230 Frankfurt am Main 80, Frankfurt, Germany. The ETFE film has a shear strength of 9 N/mm$^2$ at 200 degrees Celsius, elongation strength of 6 N/mm$^2$ at 200 degrees Celsius, and a melting point of 260–270 degrees Celsius. This material meets all of the requirements defined for the process of the invention. Other materials which meet these requirements may be used, and the advantages of the invention will be obtained.

The process shown in FIGS. 3 and 4 will provide packages formed with dambarless leadframes, however, a number of problems have been identified in production which require additional process steps to enhance yield. The release films 65 and 67 in FIGS. 3 and 4 can sometimes interfere with the bondwires and with the entry of mold compound into the cavities. It has been discovered that by prestretching the release films and then applying a vacuum in the cavities before the lead frames are introduced, the films 65 and 67 can be pulled into the cavities and will therefore not interfere with either the leadframes or the mold compound as it flows into the cavities. This vacuum molding process provides a means to use the release films 65 and 67 to achieve reliable, uniform package shapes and release, and also to enhance the control of the interlead flash such that no deflash or trim steps are needed.

Figure 5:
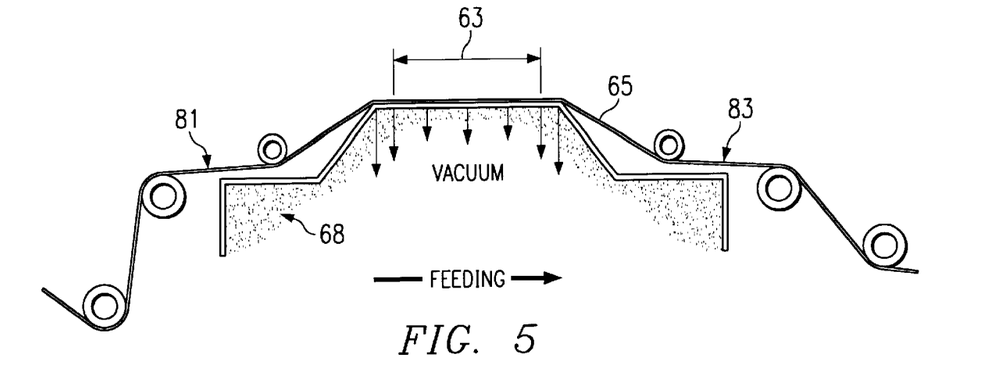
FIG. 5 depicts a cross-sectional view of the application of the release film of the invention to a bottom mold cavity.

FIG. 5 depicts the release film supply mechanism and the bottom mold 68, and illustrates the first stretching step required to prepare the bottom release film. In FIG. 5, film supply mechanism 81 provides a source of the bottom release film. Film takeup mechanism 83 takes up the used release film in a continuous spool. The release film 65 is fed over the bottom mold 68 and cavity 63 by the combined operation of the supply mechanism 81 and the takeup mechanism 83.

In operation, after a molded part is removed from the bottom cavity, film takeup mechanism 83 pulls away the used release film 65 and automatically indexes a new segment of the continuous film supply over the bottom cavity 63, the new film being supplied by supply mechanism 81. By setting the friction in the supply mechanism 81, it is possible to control the amount of stretching that occurs as the film is taken up and indexed by film takeup mechanism 83. In this way, the film is stretched as it is pulled over the bottom cavity 63.

A similar operation is used for the top die cavity and release films, which is not shown here for simplicity.

After the prestretching step shown in FIG. 5, the film 65 will be positioned within the bottom mold cavity 63, so it provides clearance away from the top and center of the cavity. This is to ensure that during the molding process the mold compound stays within the release film and does not get underneath it, and to make sure the packages are all uniform in shape. A vacuum system is used to pull the release film 65 into the bottom mold cavity 63.

Figure 6:
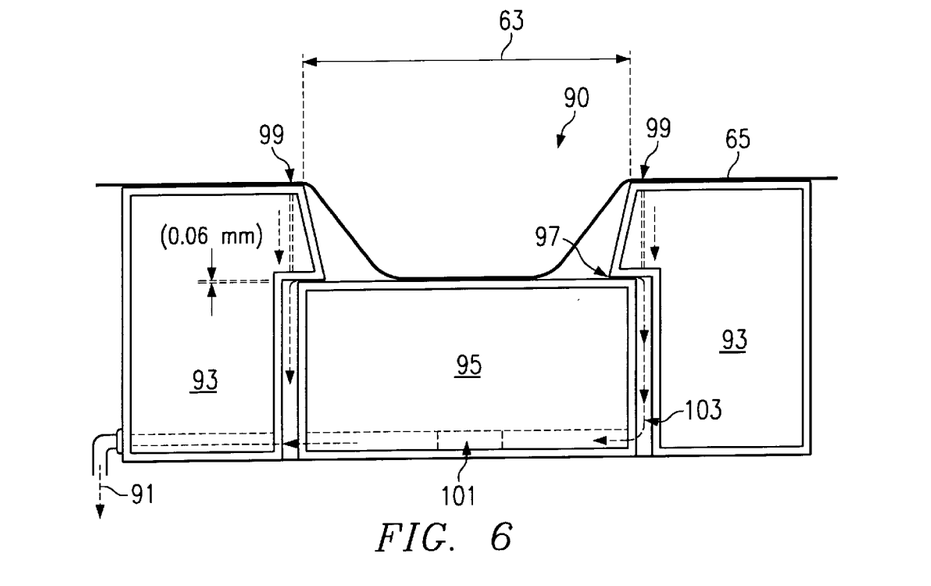
FIG. 6 illustrates the release film stretching process of the invention.

FIG. 6 depicts the vacuum system of the invention. In FIG. 6, bottom mold 90 is shown. Bottom die cavity 63 is formed from cavity block 95, which forms the bottom part of the die cavity, and cavity inserts 93, which form the sides of the die cavity 63. Vacuum line 91 is used to draw a vacuum out of the die cavity 63. Vacuum holes 99 are formed at the top lip of the die cavity in the cavity inserts 93, and attract and hold the release film 65. Vacuum ports 97 are formed at the bottom of the die cavity 63 to cause the release film to stretch into the cavity and towards the walls formed from cavity inserts 93. Slot 101 is used to form the rest of the vacuum supply and is coupled to the vacuum ports 97 by columns 103, and to vacuum supply line 91. The vacuum ports 97 are formed by a gap positioned between the top of cavity block 95 and the inserts 93, the gap then joining a larger gap which is column 103. The ports 97 are typically about 0.05–0.1 millimeters wide.

In operation, the release film 65 is positioned above the cavity 63 and prestretched as described above. The vacuum holes 99 and vacuum ports 97 of FIG. 6 are then activated. The vacuum holes 99 act as anchors which hold that portion of the film 65 which lies above the holes 99, and allows the remaining portion of the release film 65 that is above the die cavity 63 to be stretched against the anchor points. The film is stretched by the vacuum into the cavity and towards the bottom corners of the bottom die cavity 63.

The top die cavity is similarly configured, and operates in the same manner as the bottom die cavity and vacuum. Again, for simplicity the top die cavity is not shown in detail.

After the film is positioned and stretched into the cavities, the lead frames and dies are positioned and the mold is closed, as shown above in FIGS. 3 and 4. Since the release film is positioned out of the way, the mold compound can now flow into the cavities without interference and without processing errors that result without the stretched film. The mold compound then stretches the film into its final position, which pushes the film to the walls of the top and bottom cavities as shown in FIG. 3.

Figure 7:
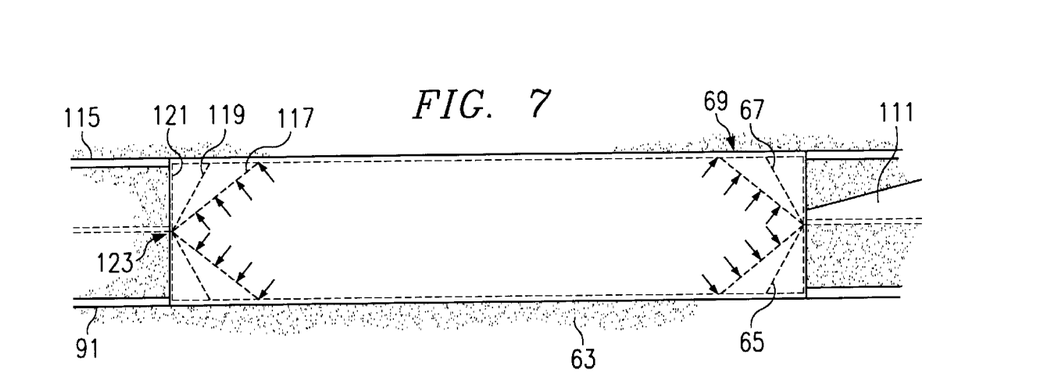
FIG. 7 depicts the various stretched positions of the release film of the invention.

FIG. 7 depicts the three stretching positions of the release film in the vacuum molding system inside the mold cavities. In FIG. 7, bottom cavity 63 is positioned in a clamped position against top cavity 69. Top release film 67 is clamped against bottom release film 65, as shown in FIGS. 3 and 4. Vacuum supply lines 91 are used to provide vacuum to bottom cavity 63. Vacuum supply lines 115 are used to provide vacuum to top cavity 69. Gate 111 is shown for supplying the cavity formed by the top and bottom cavities 69 and 63 with mold compound during molding. Reference numerals 117, 119 and 121 indicate three position lines. Line 117 illustrates the position of the release films when vacuum is first applied. Line 119 illustrate the position of the release films after the films are stretched in response to the vacuum. Line 121 indicates the position of the release films after the molding compound is supplied to the cavity and stretches the films out to the cavity surfaces of top and bottom cavities 63 and 69. Anchor point 123 indicates the vacuum hose where the release films are clamped so that they can be stretched into the cavity. So the top and bottom release films are stretched in three phases; first to line 117 when the vacuum is first applied to the cavities 63 and 69, then to line 121 in response to the vacuum, and finally to line 121 and to the cavity surfaces when the mold compound is compressed into the cavity.

The process as shown thus far will result in satisfactory dambarless lead frames for certain lead frames which have fine pitch leads and have small interlead spacings. However, in some instances additional modifications to the lead frame design are required to achieve adequate or complete elimination of interlead flash. Using the release films as shown in FIGS. 3 and 4 with the vacuum of FIGS. 6 and 7 will result in the release films filling the spaces between the leads and stopping the mold compound at the package edge for most leads. Occasionally, the mold compound will escape the release films at the seam or interface and form interlead flash in the form of splinters. Additional changes to the dambarless lead frame are preferable to eliminate the interlead splinters so that no deflashing is required after molding.

Figure 8:
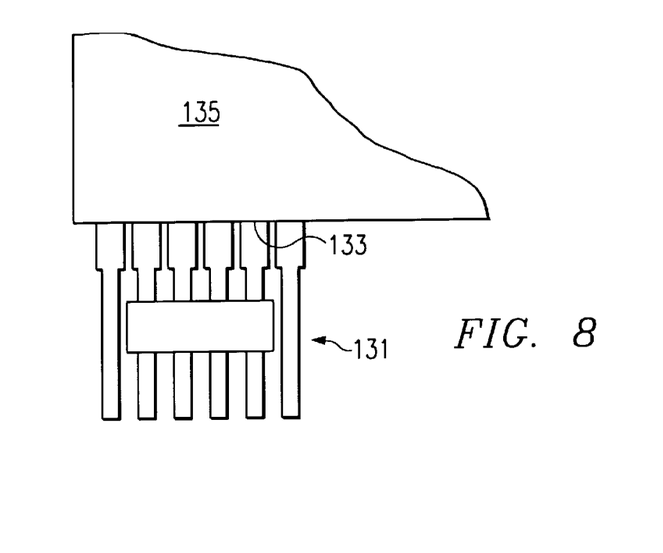
FIG. 8 depicts a package formed with the dambarless leadframe of the invention.

FIG. 8 depicts a portion of an improved lead frame design for use in the dambarless molding system of the invention. In FIG. 8, leads 131 are shown extending out from the edge 133 of package 135. The leads are wider at the clamping edge of the top and bottom mold cavities to reduce the interlead spacing distance at the clamping point to less than 0.20 mm. Preferably, the spacing distance at the package edge or clamping point should be less than 0.15 mm. Reducing the interlead spacing distance at this point improves the seam at the interface between the top and bottom films during the molding process, and thereby eliminates the interlead splinters which result if the distance is not reduced. The modification to the lead frame design is straightforward and may be done using conventional means by the lead frame manufacturer.

Additional modifications are preferred to replace the stability and lead planarity support previously provided by the dambars of the prior art leadframes. An internal tape support system is used as one alternative. Another alternative is to provide a liquid polymer material which can be dispensed at the internal ends of the lead fingers and then cured to provide the required stability. The lead frame manufacturer can perform these steps when the leadframes are produced.

When the modified dambarless leadframes with tape are used in the film release vacuum molding system of the invention, packages are produced which advantageously do not require removal of dambars or removal of interlead flash using deflashing steps. Occasionally, however, a package defect occurs because the mold compound enters the cavity under the bottom film. In a preferred embodiment, the mold compound is supplied in a prepackaged plastic wrapper. The plastic wrapper is used in the molding process to direct the mold compound to enter the cavities above the bottom release film, therefore the defects caused by the mold compound getting beneath the release film are reduced or eliminated.

Figure 9:
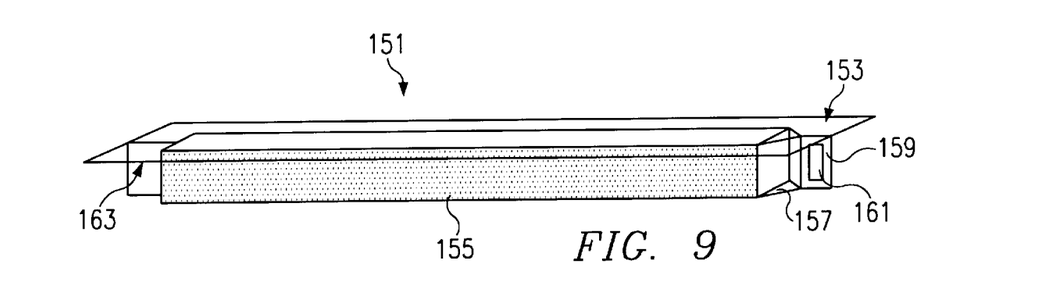
FIG. 9 depicts a prepackaged mold compound insert for use with the invention.

FIG. 9 depicts a mold compound insert 151 packaged in a plastic film. In FIG. 9, top 153 is positioned over the mold compound 155 and sleeve 157. Ends 159 are sealed by end seals 161. Edge 163 is sealed to top 153. Top 153 forms a lip that is wider than the mold compound 155 to provide support for holding the packaged mold compound in a mold receptacle. The size of the mold compound insert is determined by the mold design and by the volume and type of mold compound used.

The packaged mold compound insert 151 is preferably produced as followed. Mold compound is provided in a rectangular shape, although other shapes are feasible depending on the mold design. The mold compound is placed inside sleeve 157 within a support stand or block. Top film 153 is placed over the mold compound piece 155 and the sleeve 157. In a first embodiment, heat sealing is used to seal the top 153 to the sleeve 157. In operation, the edge seal 163 should remain impenetrable during normal storage and handling, but to open and to allow the mold compound to pass through the seal and into the runners during molding. A heat seal has been shown to meet these requirements, but alternative seals such as ultrasonic, adhesive, tape, crimping, and epoxy seals are feasible. The sealing material should be capable of maintaining a vacuum, preferably of approximately 20 millibars, and should not contaminate either the mold compound or the mold in use. After the edge seal 163 is completed, the entire piece is subjected to a vacuum. End seals 161 are then positioned and completed while in the vacuum. The vacuum sealing eliminates air and moisture that would otherwise cause voids in the molded packages. Alternatives to vacuum sealing may include shrinkwrapping the package or dipping the mold compound in plastic.

A critical element to the operation of the molding process using the prepackaged molding compound is the packaging material. The requirements for the packaging of the mold compound have been established for an integrated circuit assembly process using industrial standard requirements for molding compounds and for the resulting integrated circuit packages. The plastic package should not create residue or glue like substances in the mold during molding. The mold compound packaging should not contaminate the mold runners or receptacle. The material used in the packaging should not add to ionic contamination of the resulting packages, that is the material should not have an ionic content higher than that of the molding compounds in use in the integrated circuit packaging art. The material should not melt during the molding process, so it should have a melting temperature at least ten degrees Celsius over the molding temperatures. Typically, the material needs to have a melting point of greater than 200 degrees Celsius.

Also, the packaging material should only allow the molding compound to exit the package at selected points adjacent to the mold runners, and it should not open prematurely during the preheat phase of the molding operation. However, once the edge seals are penetrated in response to the compression of the mold compound package, the mold compound should flow out of the package with a minimum of resistance to flow. The material should not tear in normal handling or shipping, but should have the capacity to stretch into the runners when compressed during the molding process as described above. The material should be capable of vacuum sealing and of maintaining the vacuum during storage.

Although many materials may exist that could meet these requirements, it is now known that certain plastic films meet the requirements listed above. Plastic films such as those used in food storage, freezing and preparation, are particularly well suited to this application. The melting point, strength, vacuum capability and moisture and air barrier requirements for the mold compound packaging are all met by such films. The films are inexpensive and easy to purchase and use in a production environment. One preferred film is MYLAR™ polyester film, such as for example MYLAR™ 40 XM 963-AT, a polyester film for packaging available from DuPont, DuPont de Nemours Int. S.A., Geneva, Switzerland; or DuPont (U.K.) Ltd, Maylands Avenue, GB-Hemel Hempstead, England. Another preferred film is ICI™ polyester film. Similar films are commercially available from a variety of vendors.

The plastic package 151 of FIG. 9 provides the advantages of making the mold compound packages impervious to contaminants such as water that could interfere with the molding process. Since the prepackaged mold compound 155 is self packaged in plastic, storage and shipping packing materials may be inexpensive and no additional protective layers are needed. The protection of the mold compound from moisture prevents many of the package cracking problems and voids associated with moisture contaminated mold compound. The top 153 may be opaque and may carry labeling information in text and machine readable forms, such as bar codes or so called UPC labels. This labeling on the mold compound package 151 provides an easy mechanism for checking that the correct type of mold compound is being used for a particular packaging operation. Also, the plastic packaging affords the opportunity to use alternative mold compounds because the mold parts are not in direct contact with the compound.

The use of the mold compound insert package 151 with the release films further allows a variety of compounds to be used in molding, including the resin, resin filled and epoxy materials of the prior art. Additionally, the use of the package allows the use of other materials, such as adhesives and abrasives not available in the molding systems of the prior art.

Some desirable molding compounds may have poor mold release characteristics, or may be extremely abrasive. Molding the packages with these compounds in conventional molding presses can result in packaged units that will not release after molding, or alternatively, the mold surfaces will wear out much quicker than with conventional molding materials. The use of the prepackaged mold compound insert combined with the release films eliminates these problems of the prior art.

In use, the mold compound is placed in a mold receptacle that is specially shaped to receive it. A plunger shaped to fit the mold receptacle is used to compress the mold compound and the plastic package. The mold compound is left in the plastic package during molding. As the mold compound is compressed, the plastic film is stretched into the runners and is forced open by the pressure. The plastic film and runners are preferably positioned so that when the prepackaged plastic package is forced open the mold compound is forced over the bottom release film 65 within the cavities. In this way, the defects caused if the mold compound moves under the bottom release film can be eliminated.

Figure 10:
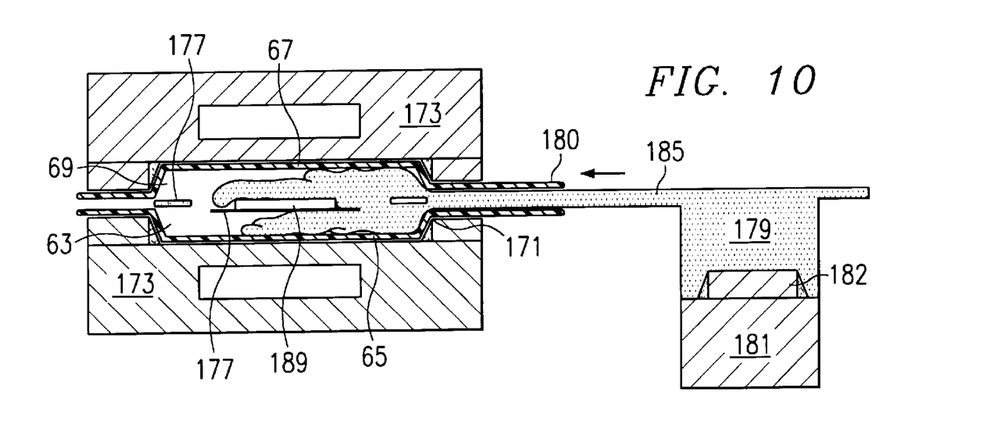
FIG. 10 depicts a cross-sectional view of the molding process of the invention using the prepackaged mold compound, the release films, and the dambarless leadframe of the invention.

FIG. 10 depicts the molding system in operation. Top mold 173 and top cavity 69 are positioned over, and clamped against, bottom mold 175 and bottom mold cavity 63. Top release film 67 is stretched over and enters into top cavity 69, as described above. Bottom release film 65 is likewise stretched over and enters into bottom cavity 63, also as described above. Leadframe 177 and die 189 are positioned in the cavity. The release films 67 and 65 are clamped together and form a seam at the interface between the leads of leadframe 177. Prepackaged mold compound insert 179 is compressed by plunger 181, the plunger tip 182 is beveled to allow the plastic package to compress more efficiently. The edge seals 183 of the prepackaged mold compound insert 179 open either in response to heat, pressure or the combination of heat and pressure and the mold compound is forced out of the plastic package and into the runner 185.

As the mold compound is forced out, the plastic package is penetrated and forced open at the runners, and the package elongates into fingers that stretch and extend into the runner 185. The mold compound is forced along the runner and between the two release films, as indicated by reference number 180. The release films are positioned in the runners such that the elongated package fingers direct the mold compound above the bottom release film 65 in the area labeled 180. Gate 171 then directs the mold compound into the cavity and between the two release films 67 and 65. The mold compound fills the cavity formed by the release films 67 and 65 and the top and bottom die cavities 69 and 63 and encapsulates the die 189 and leadframe 177. After curing, the mold is opened, the encapsulated leadframe 177 is removed along with the now empty prepackaged mold compound insert 179. The mold will not require cleaning due to the use of the prepackaged molding compound and the release films. The release films are then indexed as described above to prepare for the next molding operation.

It has further been discovered that the problems of mold compound entering the area between the bottom release film and the bottom die cavity surface can be reduced if the mold design and the leadframe design are altered to provide an open gate feature. This gate design will enhance the molding results when using the release films of the invention and reduce the probability that the mold compound will erroneously enter the area underneath the bottom release film. Further, the open gate design is more flexible than the mold designs of the prior art, as it allows for more alternative positions of the gate to provide more uniform runner lengths and better mold compound distribution. The leadframe is designed with an open area where the cavity meets the gate, to accommodate the release films and the gate design of the mold cavities.

Figure 11:
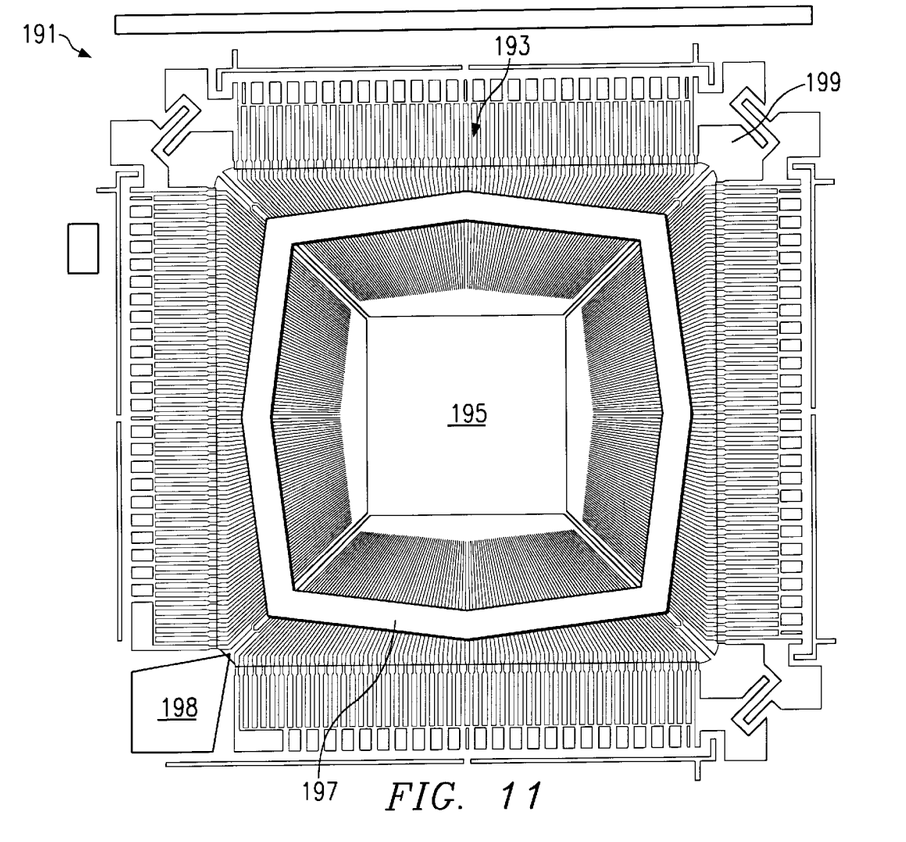
FIG. 11 depicts a top view of the dambarless leadframe of the invention.

FIG. 11 depicts a top view of an exemplary dambarless leadframe 191 which incorporates all the features of the invention described herein. Leadframe 191 has no dambar and is a 208 pin leadframe for use in producing quad flat package device. In FIG. 11, a multitude of leads 193 is shown extending away from die pad 195. Leads 193 have a reduced interlead distance formed in the mold cavity edge area. Straps 199 are used to provide stability for the die pad 195. Tape 197 is used to provide stability and to maintain lead planarity during molding. Open gate 198 is used to enable the release films to receive mold compound during molding, as described above. Leadframe 191 may be manufactured using etching, stamping or other means as is known in the art. Preferably, leadframe 191 is plated with palladium and has silver spots in the soldering regions, to improve solderability.

Figure 12:
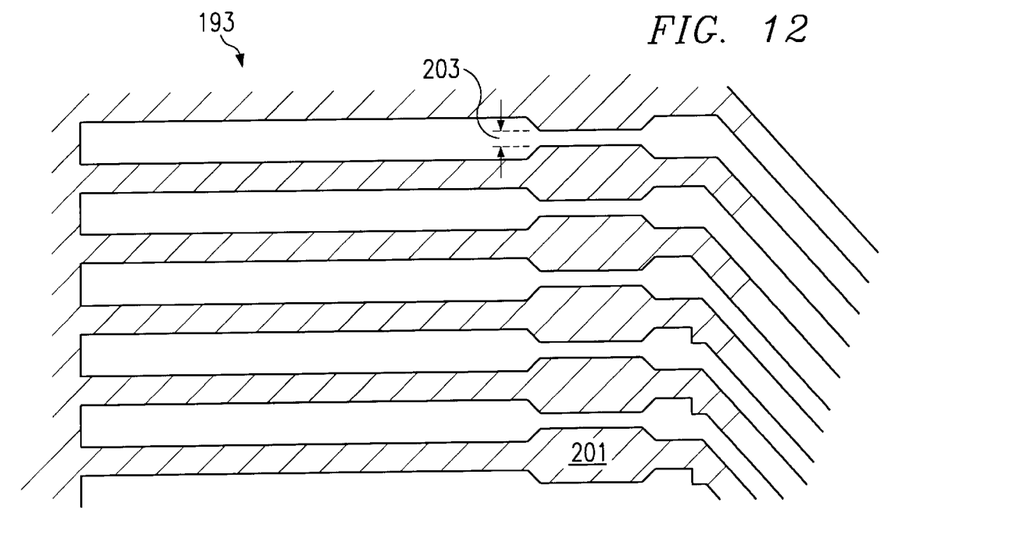
FIG. 12 depicts a portion of the dambarless leadframe of FIG. 11.

FIG. 12 depicts a detailed view of the leads 193 of leadframe 191. The leads extend from the wire bond attach area nearest the die pad and then bend and continue on to form the external leads. Interlead spacers 201 are the widened areas in the mold clamping region of the leadframe 191. These interlead spacers 201 reduce the spacing 203 between adjacent leads and also provide a uniform spacing between adjacent leads. As described above the reduced spacing ensures that the interface formed between the top and bottom release films during the molding process will prevent the mold compound from leaving the mold cavity in the areas 203 and forming interlead splinters. Preferably the interlead spacing in areas 203 is less than 0.20 millimeters, and the best results will be achieved for typical leadframe thicknesses if the spacing is less than 0.15 millimeters.

Figure 13:
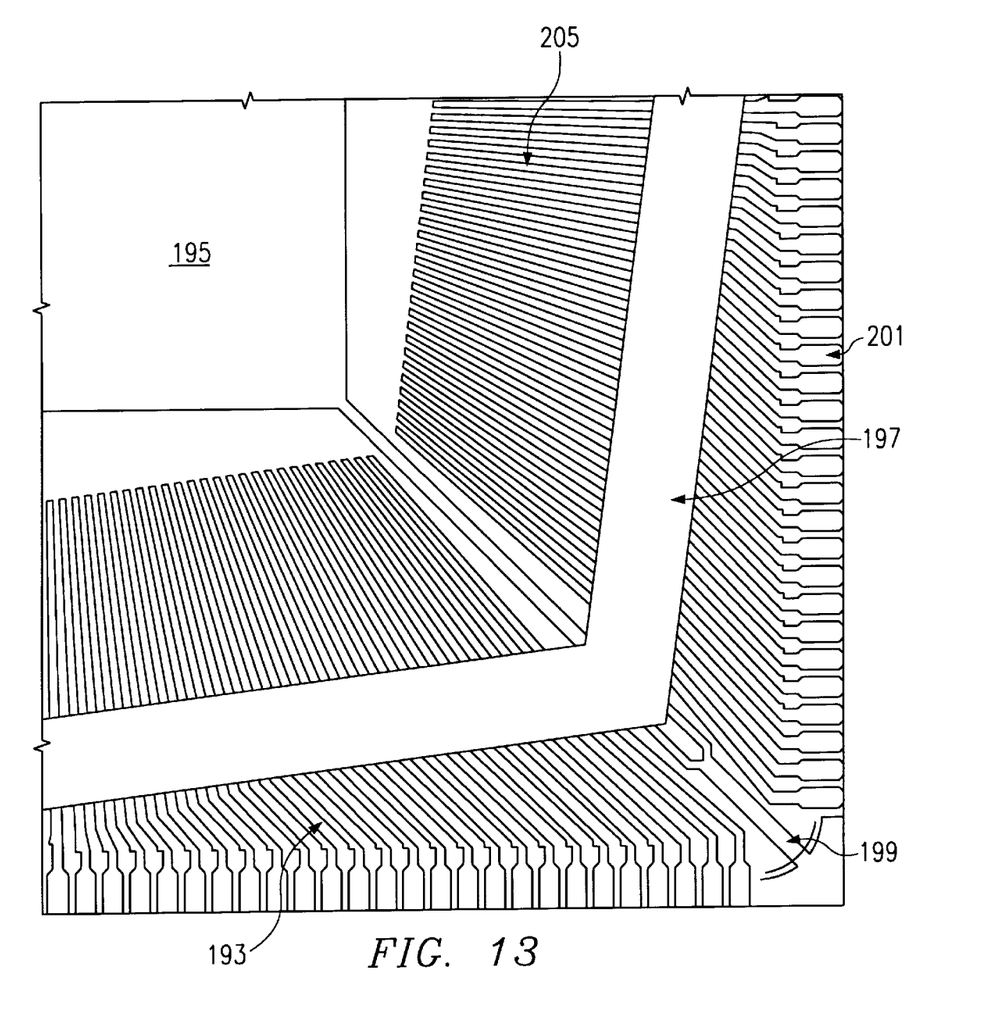
FIG. 13 depicts a second portion of the dambarless leadframe of FIG. 11.

FIG. 13 depicts the details of the stabilization tape 197 used in forming leadframe 191 in FIG. 11. Tape 197 is formed over, and adheres to, each of the leads 193 of the leadframe. The tape is positioned over, and adheres to, the die pad support strap 199, which is anchored in the corners of the leadframe 191 and provides stability and support for the die pad 195.

It has been discovered that a preferred shape for the lead stabilization tape 197 is one that provides uniform distance from the innermost end of the leads 193 to the inner side of the tape 197. This distance should place the tape as close as is feasible to the inside of the packaged integrated circuit. By maintaining the distance from the tape to the inner lead end as a uniform distance, the length of unsupported lead material 205 is approximately constant around the leadframe. Constant length of the unsupported lead portions results in a more stable configuration and improved molding results over the taping supports of the prior art, which, in contrast to the tape 197 of FIGS. 11 and 13, use nonuniform tape to inner lead distances. Nonuniform unsupported inner lead distance results in variable flexing between the tape and the inner lead ends, and thus a loss in the planarity of the leadframe during handling and molding operations. The top view of the stability tape 195 of FIG. 11 shows that when the inner lead distance is kept uniform, an octagonal shape forms. This may be described generally as a regular polygon, and is a symmetrical polygon. Other regular polygon shapes can be used as alternatives to the octagonal shape of the stabilization tape as shown in FIG. 11, and the benefit of the invention will still be obtained.

An alternative to the tape of FIGS. 11 and 13 is to form a polymer or epoxy stabilization bar in the regular polygon shape of the tape of FIGS. 11 and 13. This can be done when the leadframe is manufactured, by forming the leadframe with an internal tie bar securing the inner ends of the leadframe together, applying the tape or polymer, and if required curing can be done to harden a polymer or epoxy. The internal tiebar is then removed before the leadframe is completed.

Figure 14:
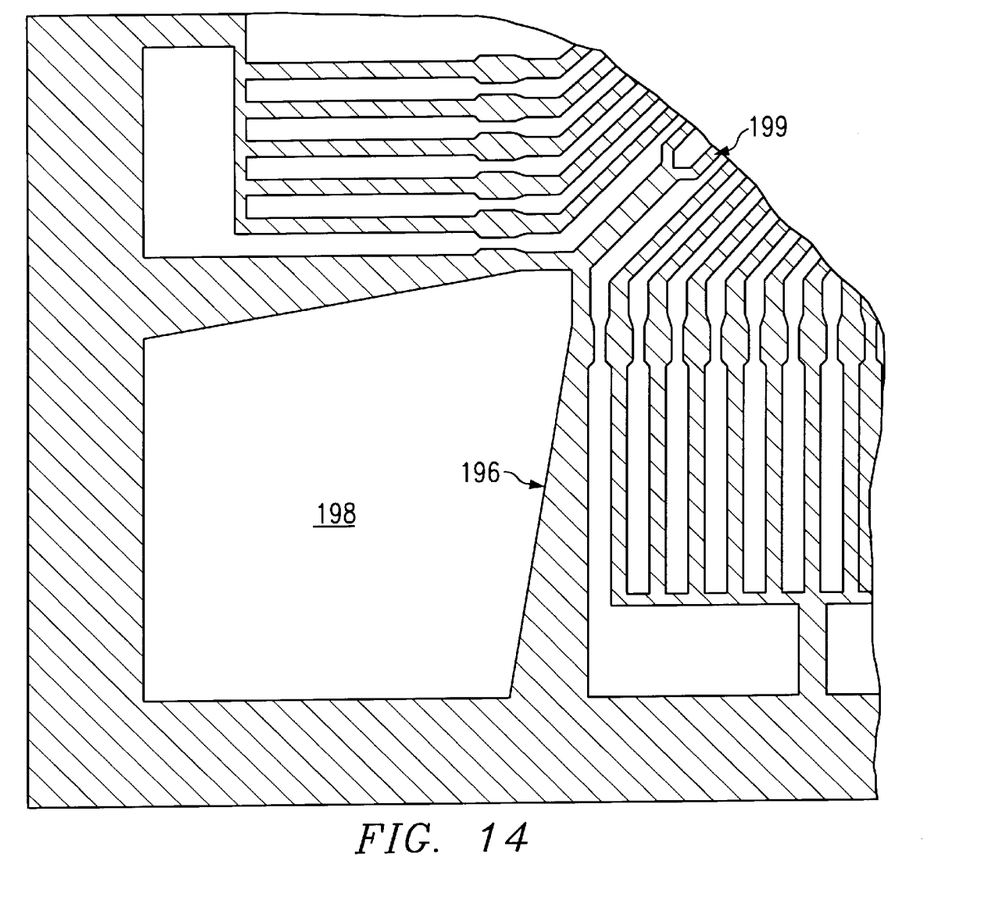
FIG. 14 depicts a third portion of the dambarless leadframe of FIG. 11.

FIG. 14 depicts a detailed view of the gate design of leadframe 191. The open gate 198 is formed in one of the corner instead of the closed gates of the prior art. Tie strap 199 then couples to the two side supports 196 of the open gate 198.

This open gate design enhances the operation of the release films and allows the molding compound to come into the top and bottom of the cavity from a central or open gate in the mold. The open gate design also allows the gate to be placed in any one of the four corners, or alternatively it could be placed elsewhere, and it therefore provides extra flexibility over the designs of the prior art in designing the mold cavities and the leadframe itself The mold cavity gate can be above, centered, or beneath the plane of the leadframe.

The use of the release films, dambarless leadframe, and prepackaged molding compound of the invention advantageously enables the packaging of integrated circuits using fine pitch leadframes without the need for the dambar trim and flash removal processes of the prior art. The use of the invention enables the production of integrated circuits using very fine pitch leads and leadframes without expensive and inefficient retooling of existing assembly facilities. Further, the use of the release films and prepackaged molding compound inserts of the invention provide the ability to use alternative molding compounds such as adhesives and high abrasives not previously available.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A dambarless leadframe for use in encapsulating integrated circuits in a mold compound, comprising:

a die pad positioned within said dambarless leadframe, and configured to receive an integrated circuit die;

a plurality of leads each having an inner end near said die pad, each extending away from said die pad to an outer lead tip, and each having a mold cavity clamping region between said inner end and said outer lead tip;

securing means for securing each one of said plurality of lead to at least some of the other ones of said plurality of leads, said securing means being formed between the inner ends and the claim0ping regions of said leads and said securing means being positioned at a substantially constant distance from the inner ends of said leads across said leadframe, said securing means comprising an adhesive applied around the plurality of leads between the inner ends and the clamping regions of said leads, the securing tape having a center window over said die pad and forming an octagon;

wherein at least one of said plurality of leads is widened in said clamping regions, such that the spacing between said at least one lead and adjacent leads does not exceed a predetermined minimum distance.

2. The dambarless leadframe of claim 1, wherein said securing means comprises a tape.

3. The dambarless leadframe of claim 1, wherein said securing means comprises a polymer applied to each of the leads between the inner ends and the clamping regions of said leads to couple said leads together.

4. The dambarless leadframe of claim 1, wherein said securing means comprises tape applied to each of the leads between the inner ends and the clamping regions of said leads, such that each one of said plurality of leads is secured to at least one other of said plurality of leads.

5. The dambarless leadframe of claim 1, wherein said predetermined minimum distance for the spacing between leads is a predetermined distance that does not exceed 0.20 millimeters.

6. The dambarless leadframe of claim 1, wherein the predetermined minimum distance for the spacing between leads is a predetermined distance that does not exceed 0.15 millimeters.

7. The dambarless leadframe of claim 1, wherein the dambarless leadframe further comprises die pad straps coupled to strap anchors for supporting said die pad, at least one of said strap anchors forming an open gate region where no leads are formed, such that during molding the mold compound may enter the die cavities through said open gate region of the dambarless lead frame.

8. A dambarless leadframe for use in encapsulating integrated circuits in a mold compound, comprising:

a die pad positioned within said dambarless leadframe, and configured to receive an integrated circuit die;

a plurality of leads each having an inner end near said die pad, each extending away from said die pad to an outer lead tip, and each having a mold cavity clamping region between said inner end and said outer lead tip;

securing means for securing each one of said plurality of leads to at least some of the other ones of said plurality of leads, said securing means being a polymer formed between the inner ends and the clamping regions of said leads and the polymer being cured to secure each one of the plurality of said leads to at least some of the remaining leads, the polymer forming an octagonal shape around said die pad;

wherein at least one of said plurality of leads is widened in said clamping regions, such that the spacing between said at least one lead and adjacent leads does not exceed a predetermined minimum distance.

9. The dambarless leadframe of claim 8, and further comprising:

die pad straps coupled to strap anchors for supporting said die pad, at least one of said strap anchors forming an open gate region where no leads are formed, such that during molding the mold compound may enter the die cavities through said open gate region of the dambarless leadframe.

* * * * *